United States Patent [19]
Causse et al.

[11] 4,315,311
[45] Feb. 9, 1982

[54] DIAGNOSTIC SYSTEM FOR A DATA PROCESSING SYSTEM

[75] Inventors: Jean-Marie Causse, Carrieres; Andre F. M. Sarre, Boulogne, both of France

[73] Assignee: Compagnie Internationale pour l'Informatique CII-Honeywell Bull (Societe Anonyme), Paris, France

[21] Appl. No.: 101,071

[22] Filed: Dec. 7, 1979

Related U.S. Application Data

[63] Continuation of Ser. No. 626,186, Oct. 28, 1975, abandoned.

[51] Int. Cl.³ .............................................. G06F 11/00
[52] U.S. Cl. ................................. 364/200; 371/16; 371/18
[58] Field of Search ... 364/200 MS File, 900 MS File; 371/16, 18, 20, 22

[56] References Cited

U.S. PATENT DOCUMENTS

| | | | |
|---|---|---|---|
| 3,343,141 | 9/1967 | Hackl | 364/200 |
| 3,576,541 | 4/1971 | Kwan et al. | 364/200 |
| 3,704,363 | 11/1972 | Salmassy et al. | 364/200 |
| 3,764,995 | 10/1973 | Helf et al. | 364/200 |
| 3,786,430 | 1/1974 | Hajdu et al. | 364/200 |
| 3,825,901 | 7/1974 | Golnek et al. | 364/200 |
| 3,876,987 | 4/1975 | Dalton et al. | 364/200 |
| 3,879,712 | 4/1975 | Edge et al. | 364/200 |
| 3,953,717 | 4/1976 | Rottier et al. | 371/17 |
| 4,025,767 | 5/1977 | Bottard | 371/16 |
| 4,030,072 | 6/1977 | Bjornsson | 364/200 |

*Primary Examiner*—Raulfe B. Zache
*Attorney, Agent, or Firm*—Kerkam, Stowell, Kondracki & Clarke

[57] ABSTRACT

There is disclosed a diagnosis system for a data processing system including at least one transmitter member having a first storing means for storing a first set of processing programs, a data processing unit having means for selectively executing the first set of processing programs, a receiver member having second storing means for storing information resulting from the execution of the first set of processing programs and a checking circuit for testing the execution of the first set of processing programs in response to test data supplied to the data processing unit. In particular, the diagnosis system comprises diagnosis means and an input/output circuit connectable to said checking circuit and to said diagnosis means. The diagnosis means, more specifically, includes a third storing means for storing a second set of diagnosis programs related to the diagnosis of the data processing unit, the transmitter member and the receiver member. Processing means is provided for executing the second set of diagnosis programs to provide test data to be transferred and stored in the second storing means, whereby a defective component within the data processing system may be ascertained, both before and during the processing of data by the data processing unit.

5 Claims, 4 Drawing Figures

FIG·2

DIAGNOSTIC SYSTEM FOR A DATA PROCESSING SYSTEM

CROSS REFERENCE TO RELATED APPLICATION

This is a continuation of application Ser. No. 626,186, filed Oct. 28, 1975, and now abandoned.

BACKGROUND OF THE INVENTION

1. Field of the Invention

This invention relates to a diagnosis system for data-processing systems.

2. Description of the Prior Art

Present-day data-processing systems are becoming increasingly complex and this greatly complicates the task of the technicians responsible for maintaining these machines when they are called upon to locate faulty circuits. The majority of known data-processing systems incorporate internal checking means which enable them to report the existence of faults. In the event of a serious fault occurring in a system which is processing data, means are generally provided to prevent incorrect results from being obtained. These means operate to terminate the carrying out of the processing operation which is under way by stopping the clock circuits of the system. In certain systems, means are also provided to report minor faults without stopping the carrying out of the processing operations which are under way. Thus diagnosis of a faulty system may be carried out either immediately, when the fault concerned is a serious one, or after the system has completed the processing operations which are under way when the fault is a minor one. Diagnostic devices exist which are connected to the systems that need to be serviced so as to feed into them instructions and data which test the various circuits by making them carry out test programs designed to locate the faulty circuits. Generally, these devices, which may be data-processing systems, operate asynchronously in relation to the faulty systems to which they are connected and matching means are required. Among the matching devices used in carrying out diagnoses, certain ones have the advantage that, with a minimum of connections, they make it possible to carry out tests using systems which may be situated either locally or remotely from the systems being serviced. However, such matching devices operate from a console which is connected to the system to be tested and do so when the latter is shut down, which involves a considerable waste of time in fault-finding. To overcome this drawback, certain data processing systems contain means which enable the data-processing units which they contain to test themselves. Such means are described in commonly-assigned U.S. Pat. No. 4,025,767—Bottard, entitled "Testing System for a Data Processing Unit," which issued from Application Ser. No. 655,244 filed Feb. 4, 1976, which was a continuation of abandoned Application Ser. No. 450,936, filed Mar. 13, 1974, based on French priority Application Ser. No. 73.09558, filed in France on Mar. 16, 1973. This test system enables the unit concerned to be tested, after error detection, both when the unit is being initialized and also while data is being processed. Relatively small special circuits are used for this purpose. The object of the unit is to locate faults at the level represented by the smallest interchangeable component in the unit. Although this test system has many advantages, in cases where the number of circuits contained in the unit to be tested is considerable, it may be a disadvantage to store test programs permanently in a memory in the unit (as described in the above-identified U.S. Pat. No. 4,025,767), inasmuch as this detracts from the processing capacity of the unit.

SUMMARY OF THE INVENTION

To overcome these drawbacks, one of the objects of the present invention is to enable a faulty data-processing system to be diagnosed automatically both before and during use.

Another object of the invention is to enable a faulty data-processing unit to be diagnosed using the minimum number of special diagnostic circuits.

Another object of the invention is to enable a data-processing unit to be diagnosed in a reliable and accurate manner.

Another object of the invention is to enable a data-processing system to be diagnosed quickly.

In accordance with the invention, a diagnosis system $S_d$ is used with a data-processing system $S_t$ and comprises means for processing data by carrying out programs, and circuits for checking these processing means which allow faulty operation on their part to be reported as a result of data being fed to the processing means. The processing means and circuits for checking are contained in at least one transmitter member which includes program storage means, a processing unit containing means to carry out selectively the programs contained in the transmitter member, and a receiver member which includes means for recording information resulting from the programs being carried out in the processing unit. When used with such a data-processing system, a preferred form of the diagnosis system $S_d$ would comprise diagnosis means, and input/output circuits included in the processing unit and the transmitter and receiver members. The input/output circuits are operated in a first mode to connect all the checking circuits in system $S_t$ individually to the diagnosis means and in a second mode to connect the diagnosis means individually to all the data-processing means in system $S_t$. The diagnosis means includes storage means contained in the transmitter member to store programs for diagnosing the processing unit and the members respectively. The processing unit includes means for carrying out the diagnosis programs selectively. The receiver member comprises recording means for recording information resulting from the execution by the processing unit of the diagnosis programs stored in the transmitter member. Each diagnosis program contains instructions to allow the processing unit to feed test data via the input/output circuits into the data processing means which is to be diagnosed and to allow it to transfer information resulting from the test carried out in this way from the tested means via the input/output circuits to the recording means in the receiver member, so that, from any signal for mis-function on the part of the data processing system $S_t$ which is transmitted by at least one of the said checking circuits to the input/output circuits, the diagnosis system $S_d$ allows any faulty member in the data processing system $S_t$ to be located, both before and during the processing of data, by having its properly functioning diagnosis means carry out at least one of the diagnosis programs.

DESCRIPTION OF THE DRAWINGS

Other features and advantages of the invention will be apparent from the following description which is given as a non-limiting example of a preferred embodiment of the invention and which refers to the accompanying drawings in which.

DESCRIPTION OF THE PREFERRED EMBODIMENT

Figure 1:
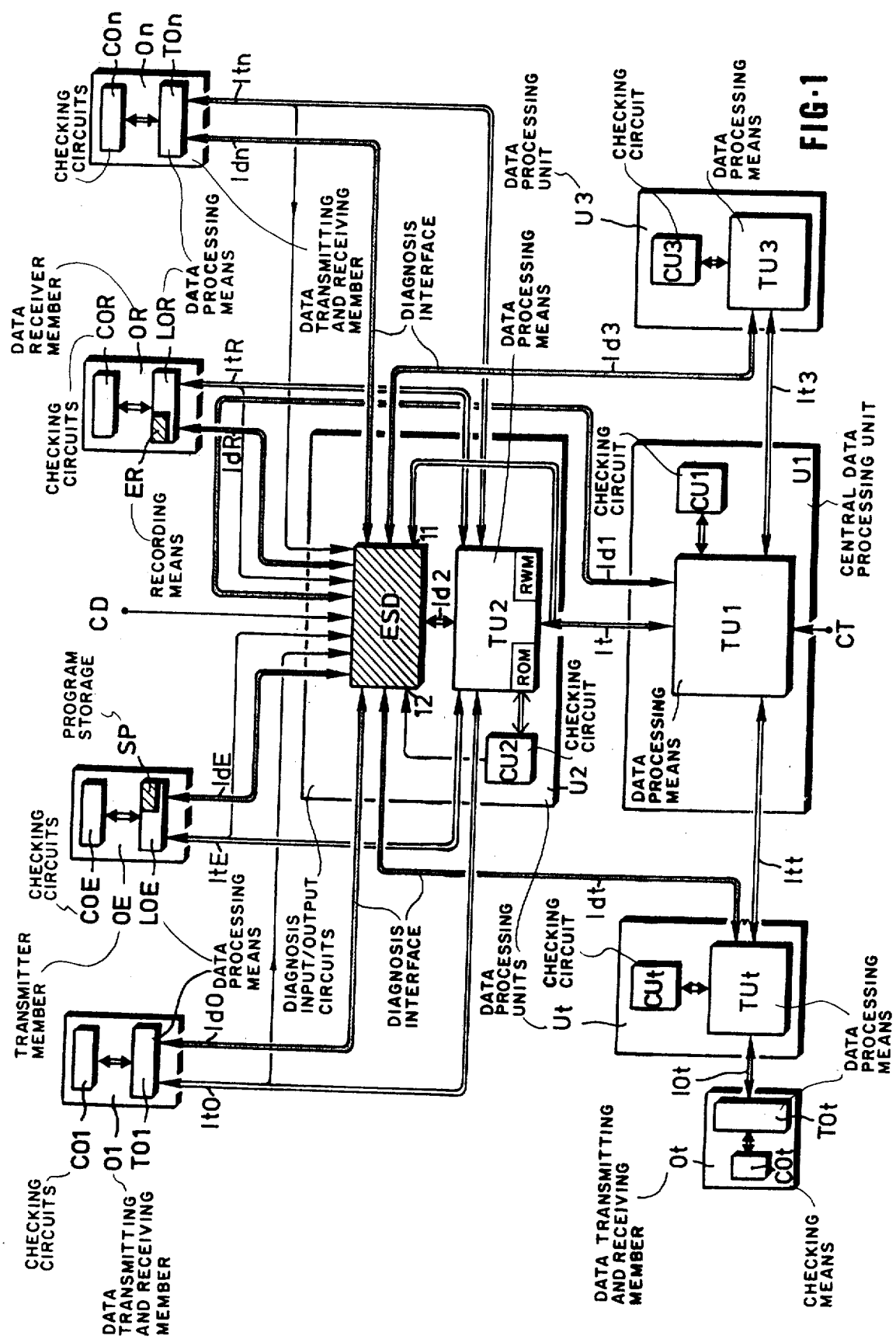
FIG. 1 is a diagram showing the principle of a diagnosis system according to a preferred embodiment of the invention for a particular data-processing system.

The data-processing system $S_t$ shown in FIG. 1 contains a central data-processing unit $U_1$ which is connected by processing interfaces $I_t$, $I_{tt}$ and $I_{t3}$ to data processing units $U_2$, $U_t$ and $U_3$ respectively. The unit $U_1$ is further connected via units $U_2$ and $U_t$, to data transmitting and receiving members which consist, in FIG. 1, of a member $O_t$ which is connected to unit $U_t$ by a processing interface $I_{Ot}$, and of members $O_1$, OE, OR, and $O_n$ which are connected to unit $U_2$ by processing interfaces $I_{tO}$, $I_{tE}$, $I_{tR}$, and $I_{tn}$ respectively. Each unit and each member in system $S_t$ in FIG. 1 incorporates means for processing data and associated checking circuits. The units $U_1$, $U_2$, $U_3$, $U_t$ incorporate data-processing means $TU_1$, $TU_2$, $TU_3$, $TU_t$, and checking circuits $CU_1$, $CU_2$, $CU_3$, $CU_t$, respectively. In processing systems such as system $S_t$, the means of processing data which are contained in their processing units are generally formed by logic circuits and memories. System $S_t$ may, for example, contain memories, termed read-only memories, which have permanently written into them programs and micro-programs which allow the system to be operated as a result of their being read by the logic circuits. Systems such as system $S_t$ likewise generally contain so-called read/write memories into which or out of which the logic circuits may write or read programs as soon as an order to put the system into operation is carried out.

Generally, a processing system is initialized before it processes data. Initialization of a system is brought about by, for example, a manual instruction for the system to be put in an operational state, such as instruction CT in FIG. 1. In the case of systems such as system $S_t$, initialization consists in resetting all the initialization memory components which they may contain to zero in order in this way to empty any registers or memories which might unfortunately happen to contain data from previous processing. Initialization likewise consists in feeding into at least one read/write memory of a system, such as system $S_t$, programs which enable the system to be used to carry out the necessary processing. In certain systems, initializing the processing units also consists in checking their circuits and memories for proper operation so that processing takes place with the system in a reliable condition. Checking of this kind is carried out in data-processing units such as that described in the above-identified Bottard U.S. Pat. No. 4,025,767. The programs, which are fed in when the system (such as system $S_t$) is initialized, are stored in at least one transmitter member in the system.

A transmitter member, such as member OE in FIG. 1, contains data-processing means LOE and checking circuits COE. Means LOE are formed by logic circuits and program storage means SP. By means of dialogues carried on through interface $I_{tE}$ between the logic circuits in means $TU_2$ and circuits LOE, member OE is able to transmit programs to unit $U_2$ which stores them provisionally in a read/write memory before carrying them out. A program is generally passed after orders and an address have been transmitted by unit $U_2$ to member OE, the address corresponding to the location of the said program in member OE. When the programs required to carry a data-processing operation are stored in at least one read/write memory in the processing unit concerned, the logic circuits address these programs in succession in order to carry out the instructions which they contain with a view to processing data coming from a transmitter member.

So that an operator may gain access to all or part of the result of a processing operation, systems such as system $S_t$ include receiver members which contain data-recording means, which data may be either the results of processing operations or else the contents of registers or memories which the operator wishes to check. A receiver member OR is shown in FIG. 1. It contains means LOR to process data and circuits COR for checking these means LOR. The means LOR for processing data of member OR are formed by logic circuits and recording means ER. Unit $U_2$ in system $S_t$ in FIG. 1 transmits data to be recorded, to member OR as a result of an order which is given to it. This order may be given as a result of manual action by the operator but it may also be given by an instruction contained in a program which the unit, such as unit $U_2$, is in the course of carrying out. The recording means, such as those associated with member OR, which need to be accessible to an operator, may for example be visual means such as those where display is by means of a screen.

In known processing systems, means exist which, by interrupting a program which is in the course of execution in a data processing unit, allow branches to be made in order that at least part of another program can be carried out in the data processing unit concerned or in another unit before returning to the interrupted program. In this way, data processing units such as unit $U_2$ and $U_t$ in FIG. 1, which exert controlling functions on members $O_1$, OE, OR, On and Ot, are able to carry on dialogues with the transmitting and receiving members connected to them, which dialogues progress independently of the processing operations being carried out in the central unit $U_1$. In particular, unit $U_2$, to which a number of members are connected, may use its own means to process data from at least one of the transmitter members which are connected to it or from the central unit $U_1$ during the time when the letter is processing other data. By means of diaglogues set up through interface $I_t$, the units $U_1$ and $U_2$ may, in particular, exchange information resulting from the processing operations which they have carried out. The checking circuits in known data-processing systems, such as systems $S_t$ in FIG. 1, comprise means which enable information coming from the various logic circuits and memories contained in the system to be compared with reference data which represents the proper operation of the circuits and accuracy on the part of the information recorded in the memories. Since the comparision means are in communication with the source of the said information being checked and since the origin of each of the information items is known, whenever the means detect that an item of information is different from the data item to which it is compared, the checking circuits allow an indication to be given that the data-processing means which they are checking is malfunctioning and enable the component which emitted the wrong information to be located. These checking circuits are generally formed by parity (or imparity) checkers which are associated with respective ones of the members to be checked and which operate on a systematic basis in the course of processing on information produced by the processing operation.

In a test system such as that described in the abovementioned U.S. Pat. No. 4,025,767, the circuits for checking a data-processing unit operate both in a first mode during the course of a test on this unit which takes place before data is processed, (i.e. when the unit is initialized) and in a second mode during the course of a test which takes place while a running processing operation is interrupted. The advantage of employing such a scheme to operate the circuits for checking a unit is that it is possible to detect and locate faults both when the unit is being initialized and while data is being processed in the unit. However, when the processing system involved is one which contains a large number of logic circuits within its units and a large number of data transmitting and receiving members (peripherals and/or terminals), the location of faults requires too many built-in test means (such as those mentioned above), to the detriment of the capacity of the processing means of the system concerned.

The diagnosis system $S_d$ which is the subject of the present invention, overcomes this drawback by using more limited diagnosis means within the processing system concerned. This diagnosis system $S_d$ makes it possible to perform a rapid, accurate and reliable diagnosis at any time, i.e. both when the processing system is being intiialized and while it is operating. Another advantage offered by this diagnosis system is that it obviates the need to stop the processing system requiring diagnosis in the event of a minor error occurring while it is operating. An error may be considered minor when it does not occur in the central data processing unit $U_1$ of the processing system or in one of the circuits which enable an operator to follow the progress of the processing operations carried out in the system. The diagnosis system $S_d$ which is the subject of the present invention diagnoses a data-processing system $S_t$ when at least one fault is detected by one of the checking circuits CO of system $S_t$, and possibly when the built-in test means in this system (such as those mentioned above) have failed to allow the fault to be located.

In FIG. 1 the diagnosis system $S_d$ comprises diagnosis input/output circuits ESD contained in unit $U_2$ and diagnosis means which are included on the one hand in unit $U_2$ and on the other hand in members OE and OR. The diagnosis means included in member OE includes means SP for storing diagnosis programs for units $U_1$, $U_2$, $U_3$, $U_t$ and members $O_1$, OE, OR, $O_n$, $O_t$ respectively. The diagnosis means included in member OR includes means ER for recording the results of the diagnosis of system $S_t$ by system $S_d$. The diagnosis means included in unit U2 are formed by this unit's own data-processing means $TU_2$, which allow access to the programs stored in member OE so that they may be executed and the results of this execution recorded in member OR.

Checking circuits $CO_1$, COE, COR, $CO_n$ of members $O_1$, OE, OR, $O_n$ are respectively connected to means TO or LO for processing data in each of these members, on the one hand so as to detect faulty operation on their part and on the other hand to report it to them by means of at least one error signal. This error signal allows the appropriate data-processing means to react to the detection of a fault so that the means can be tested and diagnosis carried out.

In the case of FIG. 1, error signals coming from circuits $CO_1$, COE, COR, $CO_n$ are transmitted to four inputs of input/output circuits ESD of the system $S_d$ which is the subject of the present invention, by interfaces $I_{tO}$, $I_{tE}$, $I_{tR}$, $I_{tn}$ respectively. The checking circuits $CO_t$ of member $O_t$ are connected to data-processing means $TO_t$, $TU_t$ and $TU_1$ by interfaces $I_{Ot}$ and $I_{tt}$. Checking circuits $CU_t$ and $CU_3$ in units $U_t$ and $U_3$ are connected to data processing means $TU_1$ by interfaces $I_{tt}$ and $I_{t3}$, respectively, and by data processing means $TU_t$ and $TU_3$, respectively. Data processing means $TU_1$ also receive the error signals generated by checking circuits $CU_1$. The various error signals emitted by checking circuits $CO_t$, $CU_t$, $CU_3$ and $CU_1$ are transmitted by data processing means $TU_1$ and interface $I_t$ to four respective inputs 11 of circuits ESD. Checking circuits $CU_2$ and of unit $U_2$ are connected on the one hand to means $TU_2$ and on the other to input 12 of circuits ESD.

As a result of an error signal transmitted by checking circuits $CU_2$ to data processing means $TU_2$, data processing unit $U_2$ may report to the remainder of system $S_t$ (in particular to central unit $U_1$ via interface $I_t$) that it is malfunctioning and may thus interrupt a dialogue which is under way, at interface $I_t$ for example. Through input 12 of input/output circuits ESD, checking circuits $CU_2$ allow access to system $S_d$, as also do the other inputs of the input/output circuits ESD. Depending on the origin of the error signals received by these various inputs, checking circuits ESD transmit different control signals along a diagnosis interface $I_{d2}$ which connects them to the diagnosis means of system $S_d$. Depending on the control signals received from interface $I_{d2}$, data processing means $TU_2$, which form part of system $S_d$, have access to the program for diagnosing the member or unit which has emitted the error signal which gave rise to the control signal. If data processing means $TU_2$ receive a diagnosis ordering signal while they are carrying out a data-processing program, the program which is being carried out may be interrupted, using means familiar to that man skilled in the art which are described above, and by means of a dialogue which takes place through interface $I_{tE}$, means $TU_2$ have access at least to the required diagnosis program.

The various diagnostic programs for system $S_t$ (which are contained in member OE) which are used by the diagnosis system $S_d$ are drawn up to suit the data-processing means of the system $S_t$ concerned. In known diagnosis arrangements which employ diagnosis programs to diagnose data-processing units for example, carrying out these programs makes it possible to test the various circuits and memories in the units by feeding into them reference data in response to instructions contained in the programs so that the associated check circuits, by detecting at least one item of erroneous data of known origin, will make is possible to locate a faulty member in the unit which is being tested by one of the programs. The respective diagnostic programs for units $U_1$, $U_2$, $U_3$, $U_t$ and members $O_1$, OE, OR, $O_n$ and $O_t$ contain instructions for these units and members to be tested as a function of the corresponding data-processing means which they contain. By reading the diagnosis programs contained in member OE, means $TU_2$ of system $S_d$ are able to test the data-processing means of system $S_t$ by transmitting to them instructions and reference data via processing interface $I_{d2}$ and input/output circuits ESD. By means of individual diagnosis interfaces, inputs of the various data-processing means of system $S_t$ are connected to separate outputs of input/output circuits ESD.

In FIG. 1 a first group of outputs of input/output circuits ESD is connected to data processing means $TU_1$ by diagnosis interface $I_{d1}$. A second group of outputs of input/output circuits ESD is connected to data processing means $TU_3$ by interface $I_{d3}$. A third group of outputs is connected to data processing means $TU_t$ by interface $I_{dt}$. Four other groups of outputs of input/output circuits ESD are connected to the data-processing means of members $O_1$, OE, OR, $O_n$ respectively by diagnosis interfaces $I_{dO}$, $I_{dE}$, $I_{dR}$, $I_{dn}$. If, for example, an error is detected in data processing unit $U_3$, the data processing means $TU_2$ gain access to the diagnosis program for this unit via interface $I_{tE}$, and data processing unit $U_3$ is tested as a result of the transmission of test data and instructions to data processing means $TU_3$, via the interface $I_{d2}$ which connects the data processing means $TU_2$ to input/output circuits ESD and via the interface $I_{d3}$ which connects input/output circuits ESD to means $TU_3$. When circuits $CU_3$ detect an error while unit $U_3$ is being tested, the fault symptons of means $TU_3$ are transmitted by interfaces $I_{d3}$ and $I_{d2}$ to data processing means $TU_2$, and these symptoms are recorded in member OR via interface $I_{tR}$. From the fault symptoms recorded in member OR, a maintenance technician is able to locate at least one faulty component in data processing unit $U_3$.

In FIG. 1, member $O_t$ is so connected to the diagnosis system $S_d$ that the latter is able to diagnose it via processing interface $I_{Ot}$ and diagnostic interface $I_{dt}$. The test instructions and data for member $O_t$ are transmitted to data processing means $TU_t$ by interface $I_{dt}$. If a data processing operation which involves data processing means $TU_t$ is in the course of execution, the processing operation in data processing means $TU_t$ is interrupted so that the means may transmit the instructions to tested member $O_t$.

In FIG. 1 are shown manual instructions or controls CT and CD for systems $S_t$ and $S_d$, respectively. Control CT allows data-processing system $S_t$ to be switched or initialized to an operational state at any time. Similarly control CD allows the diagnosis system $S_d$ to be put into operation both when the system $S_t$ is being initialized and while data is being processed. The diagnosis means of system $S_d$ being in the form of data-processing means of system $S_t$ such as those shown in FIG. 1, may be shown to be faulty by the checking circuits of the said data-processing means. Thus, in FIG. 1, checking circuits COE may detect faults in transmitter member OE (i.e. the member OE which is controlled by circuits ESD), diagnosis circuits COR may detect faults in the diagnosis receiver member OR (i.e. the member OR which is controlled by the input/output circuits ESD) and similarly with checking circuits $CU_2$ and data processing unit $U_2$ (which is controlled by circuits ESD). If transmitter member OE and receiver member OR transmit error signals produced by their respective checking circuits COE and COR, the data processing unit $U_2$ (which is controlled by circuits ESD) which receives these signals by its data processing means $TU_2$, carries out the diagnosis programs for transmitter members OE and OR respectively, provided of course that the checking circuits have access to these programs, which are stored in circuits LOE of member OE, are not defective. If data processing unit $U_2$ transmits an error signal produced by checking circuits $CU_2$, data processing means $TU_2$ are tested by means of the diagnosis program for the data processing unit $U_2$, provided that the data processing means $TU_2$ having access to this program, which is stored in the circuits and memories of data processing means $TU_2$, are not faulty. The data processing means LOE and $TU_{21}$ having access to the diagnosis programs for members OE and OR and for unit $U_2$, which are contained on the one hand in member OE and on the other in unit $U_2$, are diagnosed, for example, by recording in member OR all the data produced by these access means so that a maintenance technician will be able to identify the fault symptoms and carry out the repairs required to put system $S_d$ back into a state of satisfactory operation.

Figure 2:
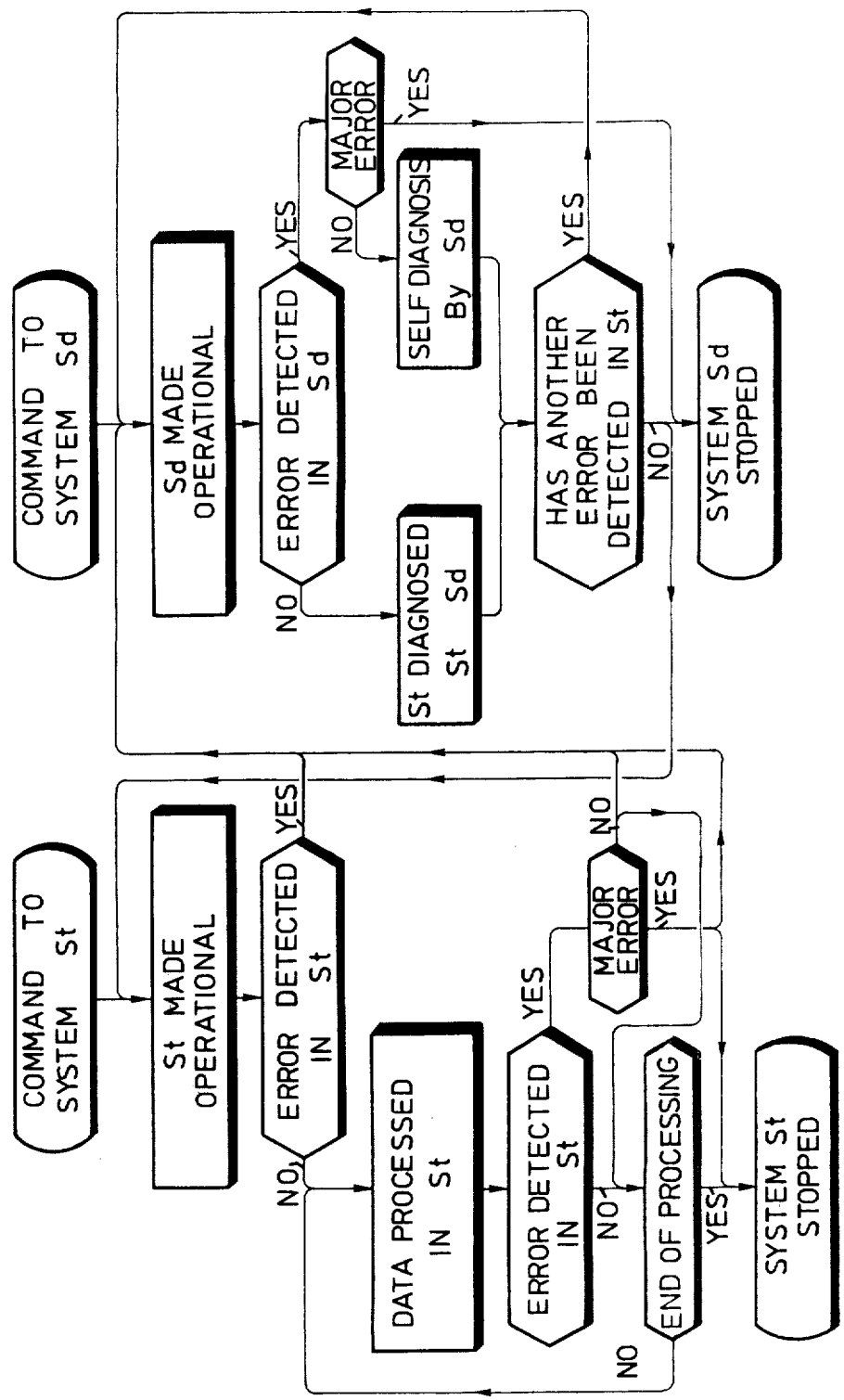
FIG. 2 is a flow-chart showing the principle on which a diagnosis system according to the invention operates.

The principle of the manner in which systems $S_t$ and $S_d$ in FIG. 1 operate in relation to one another is shown in FIG. 2. If, as a result of an automatic or manual command (as in FIG. 1), the data processing system $S_t$ is made ready to operate by being initialized (as described above), without any error being detected by its checking circuits, a first data-processing operation may be commenced. As long as no errors are detected in the course of data-processing in system $S_t$, the system continues to operate until all the processing operations which need to be carried out have been completed. If, as a result of a manual or automatic command (as in FIG. 1), the diagnosis system $S_d$ is made operational while the data processing system $S_t$ is quiescent, and if when the data processing system $S_t$ is tested by the diagnosis system $S_d$, no fault is detected by the checking circuits of the data processing system $S_t$, the data processing system $S_t$ may be made ready for operation by being initialized. In the event that, the data processing system $S_t$ having been made operational while the diagnosis system $S_d$ is quiescent, at least one error is detected by the checking circuits of the data processing system $S_t$ either at initialization or while data is being processed in the system, the diagnosis system $S_d$ is brought into operation by means of at least one error signal transmitted by the checking circuits, as in FIG. 1. If after being brought into operation, the diagnosis system $S_d$ fails to detect a fault (using the checking circuits of system $S_t$) in its own diagnosis means, it carries out a diagnosis of the data processing system $S_t$ (in which an error has previously been detected) so that it can then cause the data processing system $S_t$ to be returned to the operational state, assuming that no error is detected in it. If, when the diagnosis system $S_d$ is brought into operation an error is detected in its own diagnosis means, the diagnosis system $S_d$ diagnoses itself, using the means described above, in order subsequently to allow it to be returned to a state of satisfactory operation for the purpose of diagnosing the data processing system $S_t$. If, after the data processing system $S_t$ is made operational, the checking circuits of the data processing system $S_t$ detect the errors in certain data-processing means which also form part of the diagnosis means of system $S_d$, the diagnosis system $S_d$ is made operational in turn and, using its own checking circuits, detects an error in its own diagnostic means. This being so, once the diagnosis system $S_d$ has carried out its self-diagnosis and has been repaired, the diagnosis system $S_d$ will no longer detect an error in the data processing system $S_t$ after it has been made operational since the faulty means were common to the two systems.

In the case of systems $S_t$ and $S_d$ in FIG. 1, for example, when an error is first of all detected in the data processing unit $U_2$ of system $S_t$, once it is brought into operation, the diagnosis system $S_d$ in turn detects an error in this same unit $U_2$, which automatically causes self-diagnosis by the diagnosis system $S_d$. Where at least one error is detected in the data processing system $S_t$ in the course of data-processing, the diagnosis system $S_d$ is brought into operation, but the data processing system $S_t$ is not stopped so long as the processing operations to be carried out are as yet uncompleted. If, in the case of FIG. 1 for example, an error is detected in the data processing unit $U_3$, unit $U_1$ transmits an error signal (produced by circuits $CU_3$) to the input/output circuits ESD via processing interface $I_t$ while continuing with the processing operation which is under way. If an error is detected in the data processing unit $U_2$ while data is being processed, the remainder of system $S_t$ continues to process the data while unit $U_2$ breaks off the processing operation on which it is engaged in order temporarily to operate in the diagnosis system $S_d$. Everything that has been said about FIG. 2 applies in the case, which is that most frequently encountered, of errors which are termed minor in contrast to major errors (such as have been defined above) which occur either in the central processing unit $U_1$ or in the circuits which enable an operator to check the progress of the processing operations in the data processing system $S_t$. These latter circuits, termed communications circuits, are, in the case of FIG. 1 for example, partly located in data processing means $TU_2$ and one of the members which are connected to unit $U_2$. A major error may also occur in system $S_d$, as is the case with, for example, an error which is located in the means providing access to the diagnosis programs of the diagnosis system $S_d$.

In the event of a major error being detected in the data processing system $S_t$, not only is the diagnosis system $S_d$ brought into operation but the operation of the data processing system $S_t$ is stopped at the same time. In the event of a major error being detected in the diagnosis system $S_d$, since the latter cannot effectively intervene to diagnose the data processing system $S_t$, it is stopped. In known processing systems, the stopping operation is generally performed by stopping clock circuits using the major-error signals produced by the checking circuits. Thus, in FIG. 1 a signal for error in unit $U_1$ causes these clock circuits (not shown) to be stopped at the same time as the diagnosis system $S_d$ is brought into operation via interface $I_t$. In the same way the clock circuits of the data processing unit $U_2$ and member OE are stopped (as to halt the operation of the diagnosis system $S_d$) as a result of error signals arising from a fault in the means of access to the diagnosis programs. As for the data processing system $S_t$, the diagnosis system $S_d$ operates by carrying out diagnosis programs using initializable memory components which it contains. Making system $S_d$ operational consists in initializing it, that is to say in setting its initializable memory components (such as registers) to an initial reference state (such as zero). The memory components of the diagnosis system $S_d$ which need to be initialized are also part of the data processing system $S_t$. If an error is detected in the data processing system $S_t$ after the components of the diagnosis system $S_d$ have been initialized in the course of the initialization of the data processing system $S_t$, bringing the diagnosis system $S_d$ into operation, leads directly to self-diagnosis on its part (if data processing unit $U_2$ is malfunctioning), or to the diagnosis of system $S_t$ since the diagnosis system $S_d$ is already initialized. The means of the diagnosis system $S_d$ in the event of a major error being detected in it, consists of, for example, feeding in test data for the diagnosis system $S_d$ manually (from a maintenance panel) and displaying one by one the items of information which arrive from the system. Among these displayed data, a maintenance technician will be able to identify fault symptoms which allow at least one faulty component to be located.

Figure 3:
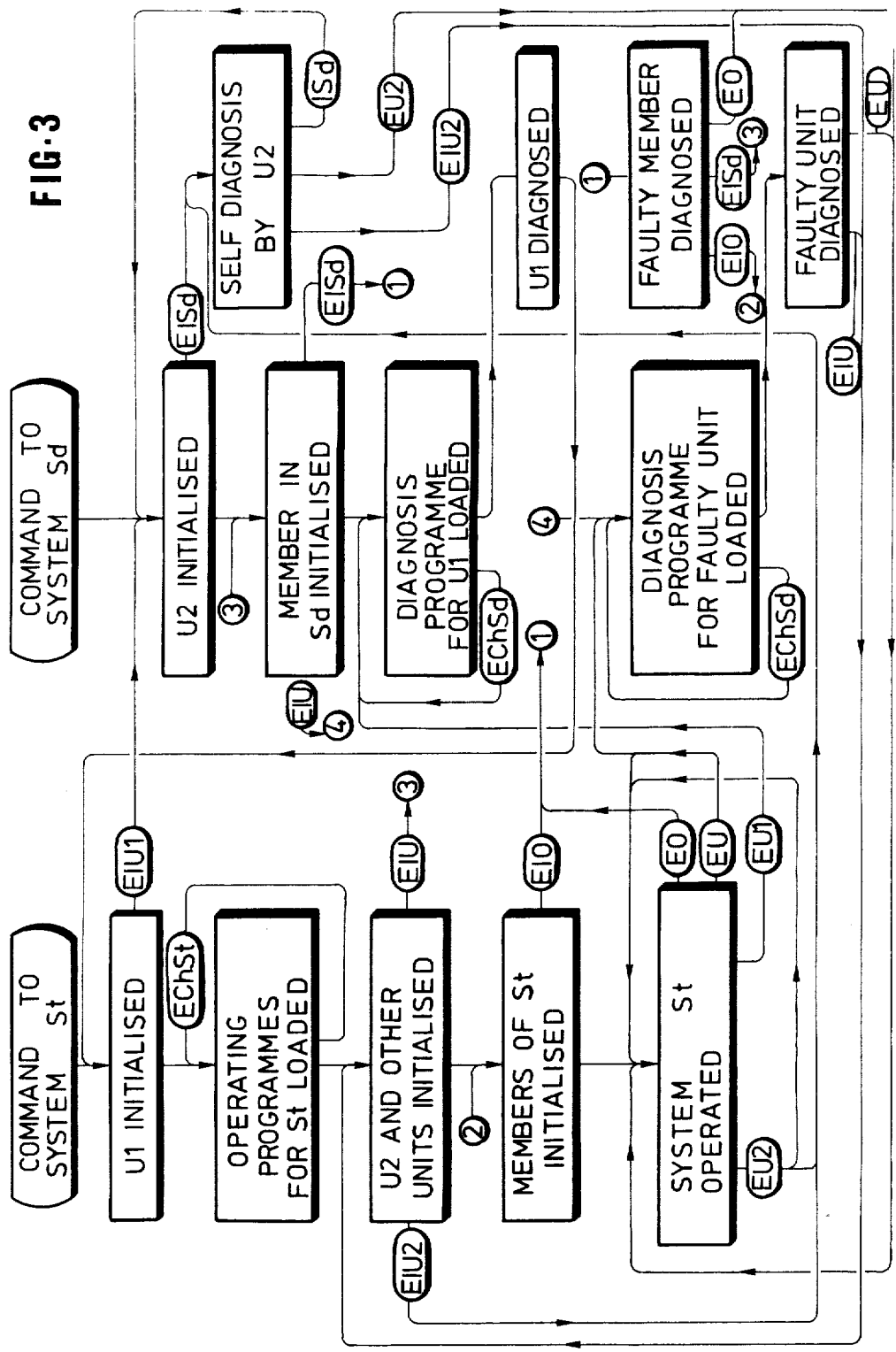
FIG. 3 is a flow-chart showing the particular way in which a diagnosis system according to the invention operates in the case of the data-processing system shown in FIG. 1.

FIG. 3 shows a particular type of operation by the diagnosis system $S_d$ forming the subject of the present invention for diagnosing the data processing system $S_d$ as shown in FIG. 1, in which major and minor errors are detected whilst the units and members respectively of which it consists are being made operational and are being operated. In particular FIG. 3 shows how the diagnosis system $S_d$ diagnoses the units and members respectively of the data processing system $S_t$ depending on the type of error which is detected in them and on its own state of operation. In FIG. 1, the data processing unit $U_1$ is the central unit of the data processing system $S_t$, and the other units include the data processing unit $U_2$ which is shown in FIG. 1 as the central unit of the diagnosis system $S_d$. FIG. 3 shows the order in which the various units and members of the data processing system $S_t$ are initialized. As a result of a command to the data processing system $S_t$, such as command or instructor CT in FIG. 1, the central data processing unit $U_1$ is initialized first, followed by unit $U_2$ and the other units. Initialization of the data processing system $S_t$ ends with the initialization of all the members in the system. FIG. 3 likewise shows the order in which the data processing unit $U_2$ and the members (CE and OR in FIG. 1) of the diagnosis system $S_d$ are initialized. To make it easier to understand the various functions performed by system $S_t$ and $S_d$ and the ways in which they are employed as dictated by the states of the systems, these states are given the same references in FIGS. 3 and 4. FIG. 3 shows that the initialization of the data processing unit $U_2$ of system $S_d$ is brought about as a result of the detection of an error ($EIU_1$), while the central data processing unit $U_1$ of system $S_t$ is being initialized. After the initialization of the central data processing unit $U_2$, assuming this takes place without an error occurring, the members (OE and OR of FIG. 1) the diagnosis system $S_d$ are initialized in turn, and the central data processing unit $U_1$ is diagnosed by fetching the diagnosis programs for this unit (from member OE to data processing means $TU_2$ via interface $I_{tE}$ of FIG. 1), provided that the diagnosis members are in a satisfactory state of operation. After the central data processing unit $U_1$ has been diagnosed and any faults corrected, the central data processing unit $U_1$ is initialized again. In the same way, if an error ($EU_1$) is detected in the central data processing unit $U_1$, while the data processing system $S_t$ is operating, once the central data processing unit $U_1$ has been diagnosed and repaired, it is once again initialized.

When either (EIU$_1$) or (EU$_1$) is detected indicative of a major error, the operation of the data processing system S$_t$ is terminated, which brings the data diagnosis system S$_d$ into operation so that the latter will diagnose the central data processing unit U$_1$ and then allow the data processing system S$_t$ to be made operational again as a result of the initialisation of unit U$_1$.

If on the other hand the initialization of the data processing unit U$_1$ takes place correctly, programs for operating the data processing system S$_t$ are loaded into the central data processing unit U$_1$. If an error (EChS$_t$) occurs while this loading is going on, the loading operation is repeated after changing the operation of the corresponding member for transmitting the programs, by means which are not described here and which do not come within the scope of the present invention. When the operating programs have been loaded, the data processing unit U$_2$ is initialized. If an error (EIU$_2$) occurs in this unit U$_2$ when it is initialized, the data processing unit U$_2$ is made to carry out a self-diagnosis by feeding test data to its own data-processing means TU$_2$, either by accessing test micro-programs which are loaded in a permanent memory which it contains, or by accessing a diagnosis program which is contained in member OE of FIG. 1 for example. In the same way, if an error (EIS$_d$) is detected in the data processing unit U$_2$ when the data processing system S$_d$ is initialized, the unit U$_2$ is caused to diagnose itself and after it has been repaired, the diagnosis system S$_d$ is re-initialized (IS$_d$). In the event of an error (EIU$_2$) occurring in the data processing unit U$_2$ after unit U$_2$ has been repaired, the other units of the data processing system S$_t$ are initialized in turn as are all the member of the system, provided no error is detected. When the last member of the data processing system S$_t$ has been initialized, the system S$_t$ is ready to be used for data processing.

If an error (EIU) is detected either while a data processing unit other than units U$_1$ and U$_2$ of the data processing system S$_t$ is being initialized, or an error (EU) is detected while the data processing system is in use, the diagnosis program for this unit is fetched by the diagnosis system S$_d$ (at 4) either after members OE and OR have been initialized (at 3), or else immediately (unit U$_2$ and members OE and OR having been initialized while system S$_t$ was being made operational). If this fetching operation progresses normally, the diagnosis of the faulty unit is then carried out by the means described. In the case when error EIU is detected, after the unit which was diagnosed has been repaired, a signal that this unit is operating satisfactorily is transmitted by the diagnosis system S$_d$ to the data processing system S$_t$, initialization of the latter having continued while the unit was being diagnosed. When the error EU is detected, after the data processing system which was diagnosed has been repaired, a signal that the central data processing unit U$_1$ is operating satisfactorily is transmitted by the diagnosis system S$_d$ to the data processing system S$_t$, the latter having continued with its current processing operations while the central data processing unit U$_1$ was being diagnosed.

If an error (EIO) is detected in a member while the member is being initialized, an order (at 1) is given to the diagnosis system S$_d$ to diagnose this member. After the member has been repaired (at 2), the diagnosis system S$_d$ indicates to the data processing system S$_t$ that the member is again operating satisfactorily. The initialization of the data processing system S$_t$ continues until all the members have been initialized. If an error (EO) occurs in a member while the data processing system S$_t$ is in use, the member is diagnosed and repaired while the data processing system S$_t$ continues to process. If an error (EU$_2$) occurs in the data processing unit U$_2$ while the data processing system S$_t$ is in use, the unit U$_2$ immediately performs a self-diagnosis, using the means already described, whilst the data processing system S$_t$ continues with the processing operations which were underway in the other units and members which it contains and which do not form part of the diagnosis system S$_d$. As soon as the fault in the data processing unit U$_2$ has been repaired, the unit U$_2$ is ready to operate in the data processing system S$_t$. Thus FIG. 3 shows that, in cases when the major errors EIU$_1$ and EU$_1$ occur, the central data processing unit U$_1$ automatically causes the data processing system S$_t$ to be re-initialized after the central data processing unit U$_1$ has been diagnosed and repaired. On the other hand, a minor error which occurs at initialization of, or during the course of operation of, the data processing system S$_t$ is some unit other than the data processing unit U$_1$ or in one of the members of the data processing system, does not prevent its initialization and operation from continuing while the faulty unit or member is being diagnosed and repaired. In the event of the data processing unit U$_2$ or one of the members of the diagnosis system S$_d$ being faulty, the data processing system S$_t$ is returned to its operational state either as a result of self-diagnosis by the data processing unit U$_2$ or as a result of diagnosis of the faulty member, so that it may then possibly diagnose the data processing system S$_t$ if a fault is also detected elsewhere than in the elements forming the diagnosis system S$_d$.

Figure 4:
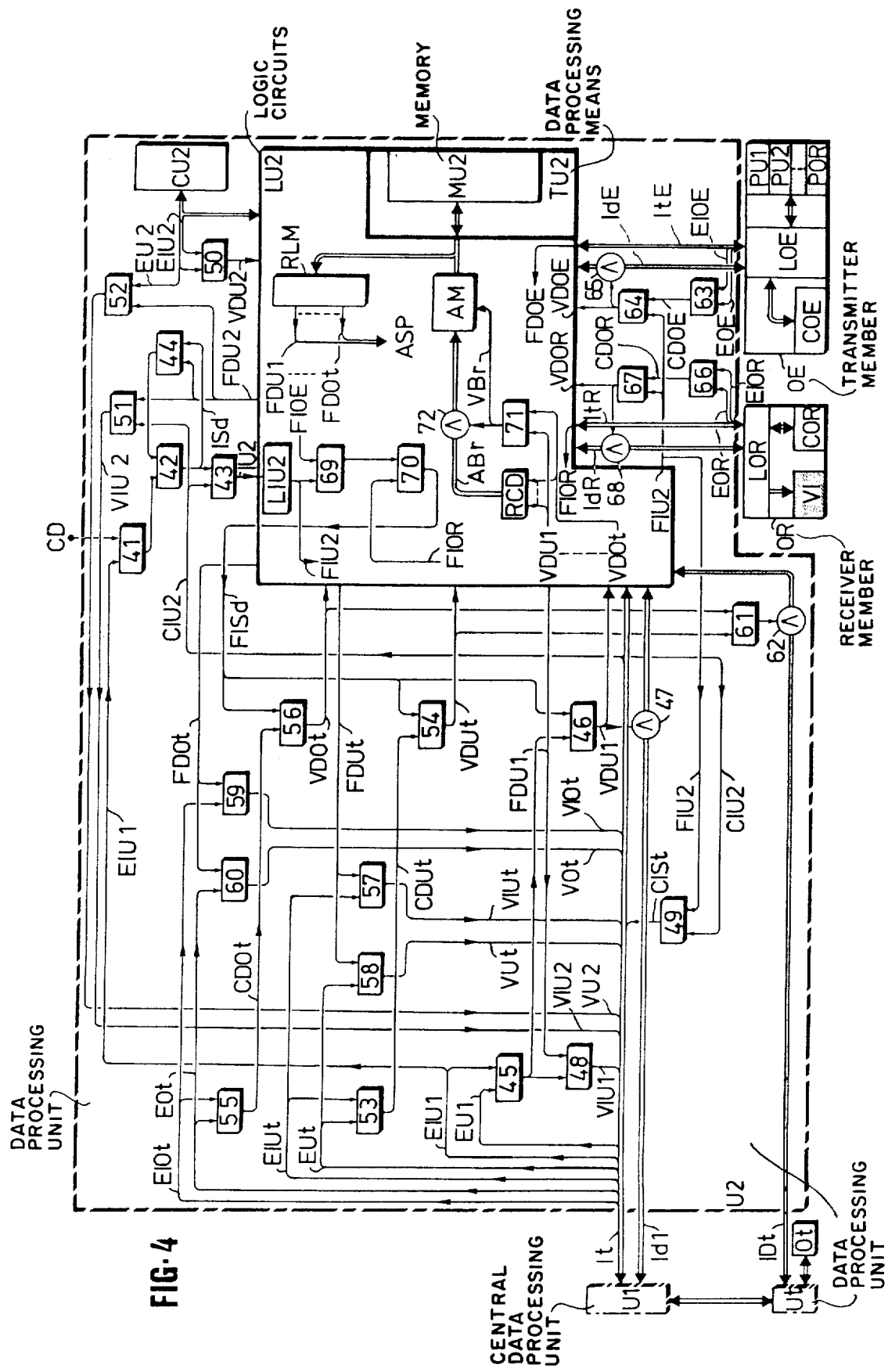
FIG. 4 is a diagram of the embodiment of a diagnosis system whose operation is illustrated in FIG. 3.

FIG. 4 shows a particular embodiment of a diagnosis system S$_d$ for a processing system S$_t$ such as that shown in FIG. 1, comprising a central data processing unit U$_1$ and two other data processing units U$_2$ and U$_t$, of which units, data processing unit U$_2$ is connected to a transmitter member OE and a receiver member OR, and data processing unit U$_t$ is connected to a member O$_t$. The data-processing means TU$_2$ are formed by logic circuits LU$_2$ which are connected to at least one memory MU$_2$, in which may be written and from which may be read programs and data. Data processing means TU$_2$ are connected to the central data processing unit U$_1$ and to members OE and OR by interfaces I$_t$, I$_{tE}$ and I$_{tR}$ respectively. Member OE includes logic circuits comprising data processing means LOE, checking circuits COE connected to the logic circuits LOE and means (connected to circuits LOE) to store programs PU$_1$, PU$_2$--POR for, respectively, unit U$_1$, unit U$_2$ and all the other units and members of the data processing system S$_t$ and in particular members OE and OR. Member OR includes logic circuits comprising data processing means LOR, checking circuits COR connected to the logic circuits LOR, and means VI connected to circuits LOR for storing data coming from the data processing unit U$_2$. The circuits ESD shown in FIG. 1 which allow systems S$_t$ and S$_d$ to be connected together, take the form in FIG. 4 which suits the method of operation shown for these two systems in FIG. 3. In response to either a command or instruction CD, or to a signal (transmitted by interface I$_t$) which indicates that an error has been detected in the central processing unit U$_1$ in the course of its initialization (EIU$_1$), the diagnosis system S$_d$ may be initialized via OR gate 41 and OR gates 42 and 43, which allows an initializing signal (IU$_2$) for the data processing unit U$_2$ to be produced.

Similarly, when the data processing system $S_t$ is being initialized, the central data processing unit $U_1$ causes the data processing unit $U_2$ to be initialized by means of a signal ($CIU_2$) which is transmitted by interface $I_t$ to one of the inputs of gate 43. In the event of an error being detected in the data processing unit $U_2$ while the diagnosis system $S_d$ is being initialized, after the diagnosis of unit $U_2$ has been completed an end-of-diagnosis signal ($FDU_2$) is transmitted to an AND gate 44. Gate 44, which also receives a signal ($IS_d$) which is produced in response to the command CD for initializing the diagnosis system $S_d$, transmits to a second input of gate 42 a signal which allows the diagnosis system $S_d$ to be reinitialized by the signal ($IU_2$) which is obtained at the output of gate 43. If either of the error signals ($EIU_1$) and ($EU_1$) generated by checking circuits $CU_1$ (of the central data processing unit $U_1$, as shown in FIG. 1) is transmitted by processing interface $I_t$ to the inputs of an OR gate 45 and thus to AND gate 46, diagnosis of unit $U_1$ is brought about by a validation signal ($VDU_1$) as derived from the output of AND gate 46. Signal $VDU_1$ is produced at the output of an AND gate 46 of which one of the inputs is connected to the output of gate 45 and the other input of which is connected to logic circuits $LU_2$, which transmits a signal ($FIS_d$) when the initialization of the diagnosis system is complete and the data processing system $S_t$ is in a satisfactory state of operation.

By known means which are not described here, as soon as one of the signals ($EIU_1$) or ($EU_1$) is transmitted from the central data processing unit $U_1$ by interface $I_t$, this interface $I_t$ blocks any dialogue for data-processing purposes while signal ($VDU_1$) validates diagnosis dialogues between units $U_1$ and $U_2$ via interface $I_{d1}$, using for example a group of AND gates 47 which transmit signals between the central data processing unit $U_1$ and the logic circuits $LU_2$. As soon as the diagnosis of the central data processing unit $U_1$ has been completed, a signal ($VDU_1$) is transmitted by the logic circuits $LU_2$ to one input of an AND gate 48 which receives at another input the signal from gate 45 which ordered the diagnosis of the central data processing unit $U_1$. In this way there is generated at the output of gate 48 a signal ($VIU_1$) which, by initializating the central data processing unit $U_1$, allows the data processing system $S_t$ to be returned to its operational state.

Under the conditions when the data processing unit $U_2$ has been initialized as a result of the signal ($CIU_2$) which was transmitted by interface $I_t$ in the course of the initialization of the data processing system $S_t$ and when the circuits $CU_2$ fail to detect an error during the initialization of the data processing unit $U_2$, a signal ($FIU_2$) is produced by the logic circuits $LU_2$. Signal ($FIU_2$) which is transmitted to one input of an AND gate 49 at the same time as signal ($CIU_2$) is transmitted to another input of this gate, allows a signal ($CIS_t$) which indicates that the initialization of the data processing unit $U_2$ has been satisfactorily completed to be transmitted through interface $I_t$, which signal allows the initialization of the data processing system $S_t$ to continue operating normally, that is to say according to the pre-established order in which the data processing units of the system are to be initialized.

By means of signal ($CIS_t$) the central data processing unit $U_1$ may, for example, then cause the data processing unit $U_t$ to be initialized via interface $I_{tt}$. If on the other hand, the checking circuits $CU_2$ detect an error while the data processing unit $U_2$ is being initialized, an error signal ($EIU_2$) is transmitted therefor to one input of an OR gate 50 the output of which gives a signal ($VDU_2$) which causes the data processing unit $U_2$ to be diagnosed. When the diagnosis of the data processing unit $U_2$ has been completed, a signal ($FDU_2$) indicating the end of the diagnosis of this unit $U_2$ is fed to one input of an AND gate 51, which gate also receives the signal ($CIU_2$) by means of which the data processing unit $U_2$ has been initialized. In this way a signal ($VIU_2$) is provided via interface $I_t$ from the output of this gate 51 which indicates to the central data processing unit $U_1$, that the unit $U_2$ is now properly initialized. By virtue of signal ($VIU_2$), the data processing system $S_t$ may, for example, continue the initializing process by initializing its members, assuming that it has been possible to initialize all the other data processing units in the normal way with no signal ($CIS_t$).

In the case of FIG. 1 for example, while the data processing unit $U_2$ is being self-diagnosed, the data processing units $U_3$ and $U_t$ are respectively initialized. If in the course of a data-processing operation checking circuits $CU_2$ detect an error in the data processing means $TU_2$ which are formed by circuits $LU_2$ and memory $MU_2$, an error signal ($EU_2$) is transmitted to a second input of gate 50 which, by means of the signal ($VDU_2$) which it emits, causes the data processing unit $U_2$ to be diagnosed. When this diagnosis has been completed, as a result of the signal ($FDU_2$) which is transmitted to one input of AND gate 52 and the signal ($EU_2$) which is transmitted to the other input of this gate, a signal ($VU_2$), which is emitted from the output of gate 52, is transmitted to the central data processing unit $U_1$, via interface $I_t$, so that the dialogues between the data processing units $U_1$ and $U_2$, which were interrupted at this interface by known means, will be resumed.

If an error is detected in the data processing unit $U_t$ either in the course of initialization or in the course of processing, signals ($EIU_t$) and ($EU_t$) are generated by the central data processing unit $U_1$ and transmitted by interface $I_t$ to the inputs of OR gate 53 which gives a signal ($CDU_t$) at its output which is transmitted to one input of an AND gate 54. When gate 54 receives at another input (simultaneously with signal ($CDU_t$)) the signal ($FIS_d$) which indicates that the data processing system $S_d$ is ready to operate, its output provides a signal ($VDU_t$) which causes the data processing unit $U_t$ to be diagnosed. If an error is detected in member $O_t$ either in the course of initialization or during the course of processing, error signals ($EIO_t$) and ($EO_t$) are transmitted by interfaces $I_{tt}$ and $I_t$ from the data processing unit $U_t$ to the inputs of an OR gate 55, the output of which gives a signal ($CDO_t$) which is transmitted to one input of an AND gate 56. When gate 56 receives signal ($FIS_d$) at another input (simultaneously with signal ($CDO_t$)), its output gives a signal ($VDO_t$) which causes member $O_t$ to be diagnosed. As was stated in relation to FIG. 3, signal ($FIS_d$) is emitted by logic circuits $LU_2$ when the data processing unit $U_2$ and members OE and OR of system $S_d$ in FIG. 4 are initialized without any error being detected, this initialization being the result either of the initialization of the data processing system $S_t$ or that of the diagnosis system $S_d$ caused by a previous diagnosis command or instruction CD. When the diagnosis of the data processing unit $U_t$ has been completed following the detection of an error in the course of initialization, signal ($EIU_t$) and a signal ($FDU_t$) indicating the end of the diagnosis of the data processing unit $U_t$ are transmitted to the respective inputs of an AND gate 57, the output of which gives a signal $(VIU_t)$ which allows the data processing system $S_t$ to continue with its initialization, assuming, in the case of FIG. 4, that it has not been possible to complete the initialization of members $O_t$, OE and OR during the diagnosis of unit $U_t$.

If the diagnosis of the data processing unit $U_t$ is accomplished after an error has been detected in the course of data-processing, signals $(EU_t)$ and $(FDU_t)$ are transmitted to respective inputs of an AND gate 58 the output of which gives a signal $(VU_t)$ which allows the data processing system $S_t$ to use the data processing unit $U_t$ to carry out processing operations. When the diagnosis of member $O_t$ is accomplished following the detection of an error during initialization, signal $EIO_t$ and a signal $(FDO_t)$ to indicate the end of the diagnosis of member $O_t$ are transmitted to respective inputs of an AND gate 59, the output of which gives a signal $(VIO_t)$ which allows the data processing system $S_t$ to continue with the initialization of its other members, assuming this has not already been done, so that it is then ready for use. When the diagnosis of member $O_t$ has been completed, following the detection of an error in the course of processing, a signal $(EO_t)$ and signal $(FDO_t)$ are transmitted to respective inputs of an AND gate 60, the output of which gives a signal $(VO_t)$ which allows the data processing system $S_t$ to use member $O_t$ to process data. In the case of the particular embodiment in FIG. 4, when an error is detected either by the checking circuits $CO_t$ (see FIG. 1) of member $O_t$ or by the checking circuits $CU_t$ of unit $U_t$ of FIG. 1, and when at least one of the signals $(EIU_t)$, $(EU_t)$, $(EIO_t)$, $(EO_t)$ is transmitted by interface $I_t$, the processing dialogues are broken off either between the data processing units $U_1$ and $U_2$ by processing interface $I_{tt}$, or between data processing unit $U_t$ and member $O_t$ by interface $I_{Ot}$. The sequel is to allow a diaglogue to take place via the diagnosis interface $I_{dt}$ which connects the diagnosis unit $U_2$ to processing unit $U_t$, this validation being brought about, in FIG. 4, by an OR gate 61 which receives at its inputs at least one of the signals $(VDU_t)$ and $(VDO_t)$ so as to give at its output a signal which allows interface $I_{dt}$ to transfer signals from data processing unit $U_2$ to unit $U_t$ and vice versa, by means of a set of AND gates 62 for example.

If an error is detected in member OE of FIGS. 1 and 4 by checking circuits COE, the error is indicated by signals $(EIO_E)$ and $(EO_E)$ which are transmitted through interface $I_{tE}$ in the course of initialization and processing respectively. If one of these signals is transmitted to one of the inputs of an OR gate 63, the gate 63 gives at its output a signal $(CDO_E)$ which is transmitted to an input of an AND gate 64 which allows an order to be given for member OE to be diagnosed by means of a signal which it emits from its output when AND gate 64 receives at another input the signal $(FIU_2)$, which indicates the end of the initialization of unit $U_2$.

By known means which are not described here, the presence of either of the signals $(EIO_E)$ and $(EO_E)$ as derived from the member OE interrupts any processing dialogue with the remainder of the data processing system $S_t$ along interface $I_{tE}$, while signal $(VDO_E)$ validates dialogues via diagnosis interface $I_{dE}$, using for example a set of AND gates 65 through which the transfer of signals along interface $I_{dE}$ takes place. In the same way error signals $(EIO_R)$ and $(EO_R)$ which are transmitted along interface $I_{tR}$ from member OR in the course of initialization and processing respectively are transmitted to the inputs of an OR gate 66 which in either case gives at its output a signal $(CDO_R)$ which is transmitted to one input of an AND gate 67 which, on receiving at another input signal $(FIU_2)$, emits from its output a signal $(VDO_R)$ to cause member $O_R$ to be diagnosed. Processing dialogues along interface $I_{tR}$ between member $O_R$ and the remainder of the data processing system $S_t$ having been interrupted (by known means) by signals $(EIO_R)$ and $(EO_R)$ dialogues along the diagnosis interface $(I_{dR})$ are validated by signal $(VDO_R)$, by means of, for example, a set of AND gates 68 which allow this interface $I_{dR}$ to transfer signals.

Since the initialization of the data processing unit $U_2$ is brought about by the signal $(IU_2)$ which is transmitted by gate 43 in FIG. 4 to the logic circuits $LU_2$ of the data-processing means $TU_2$, when the initialization is completed without any error being detected by the checking circuits $CU_2$, the initialization of members OE and OR of the data processing system $S_d$ may be brought about by command signals which are transmitted by the logic circuits $LU_2$ via interface $I_{tE}$ and $I_{tR}$ respectively. By means of these same processing interfaces, members OE and OR indicate to the logic circuits $LU_2$ of the data processing unit $U_2$ that their initialization has been completed in the proper way. As a result of the signals indicating that the initialization of members OE and OR is complete, logic circuits $LU_2$ are able to produce a signal $(FIS_d)$ indicating the completion of the initialization of the data processing system $S_d$. When the data processing system $S_d$ has indicated, by the signal $(FIS_d)$ which is emitted by the logic circuits $LU_2$, that it is ready to operate and one of the signals $(VDU_1)$, $(VDU_2)$, $(VDU_t)$, $(VDO_t)$, $(VDO_E)$, $(VDO_R)$ is transmitted to the logic circuits $LU_2$, the logic circuits establish a dialogue with member OE via interface $I_{tE}$ so as to gain access, via certain of the data-processing means in the data processing system $S_t$, to the diagnosis program appropriate to the origin of the diagnosis validation signal. If signal $(VDU_1)$ for example is transmitted, as a result of a dialogue on interface $I_{tE}$, the data processing unit $U_2$ has access to the diagnosis program $PU_1$ for unit $U_1$. Diagnosis program $PU_1$, which is initially stored in member OE, is transferred by the logic circuits $LU_2$ into the memory $MU_2$ of unit $U_2$. The diagnosis program $PU_1$ is further disclosed in the text entitled "Operating Systems Survey" of the Comtre Corporation, ed. 1971, Auerbach Publishers Inc., and U.S. Pat. No. 3,343,141 describes specific instructions by which a data processing unit is tested. Program $PU_1$ is then carried out as a result of the instructions contained in it being read one by one by the logic circuits $LU_2$. As program $PU_1$ is carried out, the data processing unit $U_1$ is diagnosed by means of instructions for processing test data (which is also contained in the program) which are transmitted via interface $I_{d1}$ to the data processing means $TU_1$ of the data processing unit $U_1$. Program $PU_1$ also contains instructions which are transmitted by interface $I_{d1}$ to the central data processing unit $U_1$ so that the unit $U_1$ will transmit through the same interface at least certain items of information which result from the test data being processed by its circuits. These items of information, which are received by the logic circuits $LU_2$ and, possibly, temporarily stored in memory $MU_2$, are then transferred by means of a dialogue which takes place through interface $I_{tR}$ and stored in the storage means VI in member OR (via its own circuits LOR). The signal $(FDU_1)$ indicating the completion of the diagnosis of the central processing unit $U_1$ is produced by the logic circuits $LU_2$ when, for example, an AND gate (not shown) of these circuits receives both a signal indicating that the last instruction contained in program $PU_1$ has been carried out and a signal which is given by a technician when he has completed the repair of the central processing unit $U_1$, from a maintenance panel which is connected to the diagnosis system $S_d$ either directly or via the data processing system $S_t$.

If an error is detected in member OE, the error, having been reported via interface $I_{tE}$, causes the member OE to be diagnosed as a result of a signal (VDOE) which allows the logic circuits $LU_2$ to have access to a diagnosing program POE similar to the program $PU_1$ (which is contained in the storage means of member OE). Access by circuits $LU_2$ to program POE is achieved by setting up a dialogue through interface $I_{tE}$ between the logic circuits $LU_2$ and circuits LOE, which latter circuits transmit the program through the interface $I_{tE}$. Program POE is written into memory $MU_2$ by the logic circuits $LU_2$ and is carried out as a result of the instructions which it contains being read out one by one by these same circuits. Logic circuits $LU_2$ transmit the instructions contained in program POE through the diagnosis interface $I_{dE}$, which was validated in FIG. 4 by signal (VDOE), so that test data is processed by circuits LOE and so that at least certain items of information resulting from the test are transmitted by circuits LOE through interface $I_{dE}$. As a result of a dialogue which the logic circuits $LU_2$ set up with member OR through interface $I_{tR}$, circuits $LU_2$ then transmit, using known means which are widely used in processing units, the results of testing member OE (which results they have received via interface $I_{dE}$) through interface $I_{tR}$ so that they will be recorded in the storage means VI of member OR. As stated above, if the means for access to any diagnosis program whatever contained in member OE are faulty, if the means of transferring the results a test which takes the form of carrying out a diagnosis program to the storage means VI of member OR are faulty, and/or if the means for carry out any program in unit $U_2$ are faulty, there is at least one major error in the diagnosis system $S_d$ which prevents if from operating properly to perform a valid diagnosis of the data processing system $S_t$. In this particular case, the operation of the diagnosis system $S_d$ is stopped by means familiar to that man skilled in the art which consist in stopping the clock circuits of at least one of circuits $LU_2$, LOE, LOR in response to a major-error signal.

In FIG. 4, the logic circuits $LU_2$ include a circuit $LIU_2$ for initializing the data processing unit $U_2$, which is actuated by signal ($IU_2$) as derived from AND gate 43 so that it will initialize all the memory components of means $TU_2$, via connections which are not shown since they are not necessary to the understanding of the invention. The signal ($FIU_2$) which is transmitted by circuit $LIU_2$ shows that the initialization of the data processing unit $U_2$ has been satisfactorily completed. Similarly, members OE and OR contained initialization circuits (not shown) which indicate that the initialization of the corresponding members has been satisfactorily completed by means of signals ($FIO_E$) and ($FIO_R$) respectively which are transmitted via interfaces $I_{tE}$, $I_{tR}$ to the logic circuits $LU_2$. The initialization circuit of member OE is operated by the signal ($FIU_2$) which is received via interface $I_{tE}$ and that of member OR is operated by, for example, the signal ($FIO_E$) which is received via interface $I_{tR}$ and circuits $LU_2$. Signal $FIS_d$ is produced by an AND gate 69 which receives signals ($FIU_2$) and ($FIO_E$) at respective inputs and by an AND gate 70 which is connected to the output of AND gate 69 and which receives at a second input signal ($FIO_R$) so as to give signal $FIS_d$ at its output. Access to the diagnosis program contained in storage means SP (see FIG. 1) of member OE is effected as shown in FIG. 4 for example. A register RCD (part of the logic circuits $LU_2$) comprises a set of flip-flops which are connected to the respective inputs for signals ($VDU_1$), ($VDU_2$), ($VDU_t$), ($VDO_E$), ($VDO_R$), and ($VDO_t$) which signals set them to this logic 1 state, so that each logic 1 state read in register RCD gives the address of the unit or member to be diagnosed. As the same time signal ($VDU_1$), ($VDU_2$), ($VDU_t$), ($VDO_E$), ($VDO_R$), ($VDO_t$) are transmitted to the inputs of an OR circuit 71 which produces a signal ($VB_r$) at its output as a result of receiving at least one of the signals at its inputs. Since the diaglogues between the data processing unit $U_2$ and the members connected to it are brought about by, for example, an operating program or micro-program recorded in memory $MU_2$, access to the program is divided by the circuit AM for addressing this memory, which is contained in the logic circuits $LU_2$. The signal ($VB_r$) which is generated by the OR circuit 71 validates the transfer of the contents ($AB_r$) of register RCD by means of a group of AND gates 72, while it actuates circuit AM for a possible program interruption. Each combination of logic states (0 and 1) presented by content ($AB_r$) represents a branch address which is transmitted to the circuit AM so that it will read out from memory $MU_2$ an address, which then represents the content (ASP) of an output register of memory RLM. Each combination given by content (ASP), which corresponds to a predetermined content ($AB_r$) of register RCD, is transmitted by interface $I_{tE}$ to member OE, thus giving access to a diagnosis program which is determined by the signal received at an input of register RCD. As an example, the presence of signal ($VDU_1$) at one input of register RCD and the OR circuit 71 allows an address (ASP) to be obtained at the output of register RLM which corresponds to the address of diagnosis program $PU_1$ in member OE. To indicate that the diagnosis which it has just carried out by executing a diagnosis program has been completed, unit $U_2$ produces one of the signals ($FDU_1$), ($FDU_2$), ($FDU_t$), ($FDO_E$), ($FDO_R$), or ($FDO_t$). Each of these signals is emitted by one of the flip-flops contained in register RLM when circuit AM reads out the last instruction in the diagnosis program (which is contained in memory $MU_2$) which the data processing unit $U_2$ is in the course of carrying out.

The preceeding description deals with embodiments and applications of the present invention but is in no way limiting. It effectively covers all modifications which may be applied to data-processing systems which contain any number (at least one) of data processing units, and transmitter and receiver members. The connections made by the input/output circuits ESD (see FIG. 1) between the said systems $S_t$ and $S_d$ may be produced by means of processing interfaces and special diagnosis interfaces such as those described in, respectively, commonly-assigned U.S. patent application Ser. No. 527,758 entitled "A Method and Apparatus for Exchanging Information between a Central Unit Having a Peripheral Controller in a Data-Processing Installation," filed in the United States on Nov. 27, 1974 by Bienvenu et al, and now abandoned, based on French priority Application Ser. No. 73.42714, now French Pat. No. 2,253,426; and commonly-assigned U.S. Pat. No. 3,953,717—Rottier et al entitled "Test and Diagnosis Device," which issued from Application Ser. No. 502,118, filed Aug. 30, 1974, based on French priority Application Ser. No. 73.32504, filed in France on Sept. 10, 1973. A further embodiment of the diagnosis system according to the invention for a processing system such as that shown in FIG. 1, comprises the central processing unit $U_1$ as incorporated into the diagnosis system $S_d$ in the case of certain dialogues (those of data processing units $U_2$, $U_3$, $U_t$, and member $O_t$ for example.) In this case the unit $U_1$ executes certain diagnosis programs in the capacity of a central diagnosis unit through the interface ($I_t$ in FIG. 1) which connects it to the data processing unit $U_2$, which latter, via the input/output circuits ESD, is connected to all the data processing means of the data processing system $S_t$ and, via interfaces $I_{tE}$ and $I_{tR}$, to members OE and OR of the diagnosis system. In a preferred embodiment of the invention, the transmitter and receiver members OE and OR are disposed at a maintenance panel which also incorporates the said manual controls for the two systems $S_t$ and $S_d$. The storage means of member OE are in the form of a magnetic tape and the recording means of member OR are in the form of a display screen.

What is claimed is:

1. In a data processing system including at least one transmitter member having program storage means, data processing means and checking circuits for the transmitter member; at least one data processing unit having data processing means capable of executing programs stored in the transmitter member and having checking circuits for the processing unit; and a receiver member having means for recording data resulting from the execution of programs by the processing unit, data processing means, and checking circuits for the receiver member; a diagnosis system comprising:

the program storage means of the transmitter member including means for storing diagnosis programs for the diagnosis of the data processing means of the transmitter member, the data processing means of the one data processing unit, and the data processing means of the receiver member;

the data processing means of the one processing unit being capable of executing diagnosis programs stored in the program storage means of the transmitter member;

the recording means of the receiver member including means for recording data resulting from execution in the one processing unit of diagnosis programs stored in the program storage means of the transmitter member;

each of the diagnosis programs stored in the program storage means of the transmitter member including instructions to allow the one processing unit to introduce test data into a data processing means to be diagnosed and to allow the one processing unit to transfer data resulting from the tests to the recording means of the receiver member; and a diagnostic input/output circuit responsive to error signals from the various checking circuits and operable in a diagnostic mode to read appropriate diagnostic programs from the program storage means of the transmitter member for execution by the data processing means of the one data processing unit, to connect the data processing means of the one processing unit to the data processing means to be diagnosed for the transmission of test data and instructions, and to connect the data processing means of the data processing unit to the recording means of the receiver member for recording results of diagnosis.

2. In a data processing system including at least one transmitter member having program storage means and data processing means and checking circuits for the transmitter member; a plurality of data processing units each having respective data processing means and each having respective checking circuits; the data processing means of at least one of the data processing units being capable of executing programs stored in the transmitter member; and a receiver member having means for recording data resulting from the execution of programs by the processing unit, data processing means, and checking circuits for the receiver member; a diagnostic system comprising:

the program storage means of the transmitter member including means for storing diagnosis programs for the diagnosis of the data processing means of the transmitter member, the data processing means of each processing unit, and the data processing means of the receiver member;

the data processing means of the one processing unit being capable of executing diagnosis programs stored in the program storage means of the transmitter member;

the recording means of the receiver member including means for recording data resulting from execution in the one processing unit of diagnosis programs stored in the program storage means of the transmitter member;

each of the diagnosis programs stored in the program storage means of the transmitter member including instructions to allow the one processing unit to introduce test data into a data processing means to be diagnosed and to allow the one processing unit to transfer data resulting from the tests to the recording means of the receiver member;

and a diagnostic input/output circuit responsive to error signals from the various checking circuits and operable in a diagnostic mode to read appropriate diagnostic programs from the program storage means of the transmitter member for execution by the data processing means of the one data processing unit, to connect the data processing means of the one processing unit to the data processing means to be diagnosed for the transmission of test data and instructions, and to connect the data processing means of the one data processing unit to the recording means of the receiver member for recording results of diagnosis.

3. The diagnostic system according to claim 2, wherein said data processing system includes first initialization means for enabling said data processing means to process data from an initial reference state, said initialization means being connected in a first mode of operation to said checking circuits and in a second mode of operation to said input/output diagnostic circuit, whereby said diagnostic system is responsive to a malfunction signal derived from one of said checking circuits via said input/output diagnostic circuit for effecting a diagnosis.

4. The diagnostic system according to claim 3, wherein said diagnostic system comprises second initialization means, said first initialization means comprising said second initialization means, said second initialization means responsive to the initialization of said data processing system by said first initialization means, for disposing said diagnostic system to an initial reference state before diagnosing said data processing system.

5. The diagnostic system according to claim 4, wherein said second initialization means is connected in a first mode of operation to said checking circuits and in a second mode to said input/output diagnostic circuit, said diagnostic system responsive to a malfunction signal transmitted from one of said checking circuits to said input/output diagnostic circuit for effecting the diagnosis of the components of said diagnosis system before effecting the diagnosis of the components of said data processing system.

* * * * *